United States Patent
Schiek et al.

(10) Patent No.: US 11,101,784 B2
(45) Date of Patent: Aug. 24, 2021

(54) ELECTRICAL COMPONENT WITH HEAT DISSIPATION

(71) Applicant: SNAPTRACK, INC., San Diego, CA (US)

(72) Inventors: Maximilian Schiek, Munich (DE); Bernhard Bader, Neubiberg (DE); Christian Ceranski, Munich (DE); Tomasz Jewula, Markt Schwaben (DE)

(73) Assignee: SnapTrack, Inc., San Diego, CA (US)

( * ) Notice: Subject to any disclaimer, the term of this patent is extended or adjusted under 35 U.S.C. 154(b) by 625 days.

(21) Appl. No.: 15/776,360

(22) PCT Filed: Nov. 7, 2016

(86) PCT No.: PCT/EP2016/076841
§ 371 (c)(1),
(2) Date: May 15, 2018

(87) PCT Pub. No.: WO2017/089107
PCT Pub. Date: Jun. 1, 2017

(65) Prior Publication Data
US 2020/0259477 A1    Aug. 13, 2020

(30) Foreign Application Priority Data
Nov. 24, 2015    (DE) .......................... 102015120341.3

(51) Int. Cl.
*H03H 9/02*    (2006.01)
*H01L 23/36*    (2006.01)
(Continued)

(52) U.S. Cl.
CPC ......... *H03H 9/02622* (2013.01); *H01L 23/36* (2013.01); *H03H 3/10* (2013.01);
(Continued)

(58) Field of Classification Search
CPC ........... H03H 9/02622; H03H 9/02055; H03H 9/02102; H03H 9/02834; H03H 9/0523;
(Continued)

(56) References Cited

U.S. PATENT DOCUMENTS

2002/0000895 A1    1/2002    Takahashi et al.
2004/0041496 A1*    3/2004    Imai ..................... H03H 9/6483
                                                                            310/313 D
(Continued)

FOREIGN PATENT DOCUMENTS

DE    112007002969 T5    9/2009
EP    2219417 A1    8/2010
(Continued)

OTHER PUBLICATIONS

International Search Report and Written Opinion—PCT/EP2016/076841—ISA/EPO—dated Jan. 27, 2017.

*Primary Examiner* — Jeffrey M Shin
(74) *Attorney, Agent, or Firm* — SnapTrack, Inc.

(57) ABSTRACT

In order to improve heat dissipation from electrical components with heat-generating component structures, it is proposed to provide a radiation layer with a large surface in the area of the component structures. Preferably, the radiation layer is very heat-conductive or in heat-conductive connection with the component structures.

12 Claims, 4 Drawing Sheets

Figure 1:
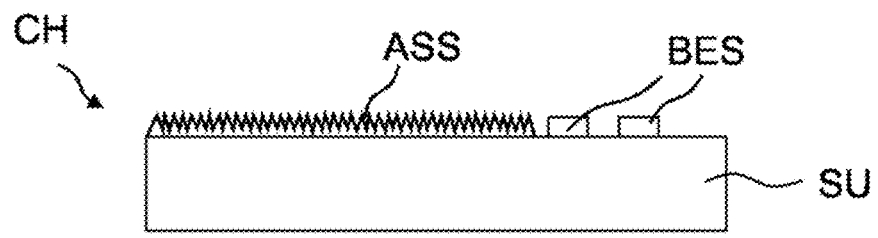

(51) Int. Cl.
*H03H 3/10* (2006.01)
*H03H 9/05* (2006.01)
*H03H 9/08* (2006.01)

(52) U.S. Cl.
CPC .... *H03H 9/02055* (2013.01); *H03H 9/02102* (2013.01); *H03H 9/02834* (2013.01); *H03H 9/0523* (2013.01); *H03H 9/08* (2013.01)

(58) Field of Classification Search
CPC . H03H 9/08; H03H 3/10; H01L 23/36; H01L 23/3731
See application file for complete search history.

(56) References Cited

U.S. PATENT DOCUMENTS

| | | | |
|---|---|---|---|
| 2008/0067546 A1 | 3/2008 | Murata et al. | |
| 2014/0333175 A1 | 11/2014 | Takemura | |
| 2015/0318461 A1 | 11/2015 | Jacobsen et al. | |

FOREIGN PATENT DOCUMENTS

| | | |
|---|---|---|
| JP | S5885611 A | 5/1983 |
| JP | 2005223580 A | 8/2005 |
| JP | 2010182958 A | 8/2010 |

\* cited by examiner

ELECTRICAL COMPONENT WITH HEAT DISSIPATION

In almost every electrical component, heat loss is created solely by the internal resistance of the component. Heat loss can heat up the entire component or lead locally to hot spots. In particular, with decreasing conductor cross-sections, local heating can rise sharply and lead to degradation effects that reduce at least the life of these components. But heating of the component can also influence the component properties in an inadmissible manner, since they are often temperature-dependent.

Components working with acoustic waves, for example in SAW or BAW technology, show a strong temperature-dependent frequency response, which is expressed by a relatively high temperature coefficient of the center frequency of the components.

BAW resonators, also referred to as SMRs (Solidly Mounted Resonators), are bulk wave components having a piezoelectric layer arranged between two electrodes and disposed on a substrate. With the help of an acoustic reflector or mirror, a descent of the wave into the substrates is prevented.

FBAR resonators are also components which work with bulk waves and are mounted with free oscillation on a membrane that spans a cavity in the substrate.

In these devices, all energy components that are neither transmitted nor reflected contribute to the loss, which either induces unintentional electromagnetic radiation, or manifests itself as an ohmic loss just in the aforementioned heating. If, for example, the center frequency of a BAW or SAW filter shifts, this can also increase the ohmic losses because the filter no longer operates at the optimum frequency. This amplifies the effect of unwanted component heating. The result is a control loop with positively amplified feedback.

Through various measures, it is possible to reduce the temperature coefficient of frequency in components working with acoustic waves. However, ohmic losses still occur in the temperature-compensated case provided there is no superconductivity. The resulting heat must be dissipated from the filter chip, which can be a problem especially in components located inside a housing. In known components, therefore, efforts are being made to incorporate thermally highly conductive materials in the housing in order to facilitate heat dissipation.

Object of the present invention is to provide a further improvement of the heat dissipation of electrical components, which is technically easy to use and can be used in a variety of components.

This object is achieved with a component according to claim 1. Advantageous embodiments of the invention will become apparent from the dependent claims.

A component according to the invention comprises a chip on which a heat-loss generating element is arranged. For improved dissipation of the heat loss, a radiation layer is applied to the chip near the place of generation, said layer being in thermal contact with the heat-loss generating element. The radiation layer has an enlarged surface, in particular a roughened surface or a surface with a 3D structure.

The radiation layer may be applied to an outer surface of the chip. But it can also be a boundary layer, in particular an interface with a very heat-conductive layer. In any case, heat transport through the radiation layer of the said roughened or otherwise structured surface is improved as compared with a layer with a smaller surface area and in particular as compared with a planar layer. According to a known formula for heat transfer at contact surfaces, the contact surface is input as a linear factor, so that heat dissipation increases approximately linearly with the surface area.

According to one embodiment, the radiation layer has a columnar structure and is formed as a polycrystalline or crystalline layer. On such crystalline or polycrystalline surfaces, by crystal-axis-oriented back-etching different crystal facets of the polycrystalline or crystalline layer may be exposed, which are inclined to the layer plane and thereby alone increase the surface area.

Ideally, a pyramidal tip forms over each crystalline phase, so that a (roughened layer) surface is retained despite a roughened surface with a plurality of pyramidal tips.

A preferred material for forming a radiation layer has a high thermal conductivity. Preferably, a material is used which is compatible with the chip itself or with the manufacturing steps of the component.

In one embodiment, aluminum nitride is used for the radiation layer, which can be grown in a columnar manner and on the surface treated so as to obtain the desired roughened surface with a pyramidal tip structure. Aluminum nitride has the further advantage of being an electrical insulator. Even when such a radiation layer is applied to or in the vicinity of electrically conductive or current-carrying elements of the component, its properties are not disturbed by aluminum nitride. Unwanted capacitive or galvanic couplings cannot arise in this way.

Furthermore, aluminum nitride has the advantage that it can be well-structured as an applied layer. It is thus possible to apply radiation layers on precisely delimited surfaces or to structure aluminum nitride layers applied over a large area in such a way that they are limited precisely to desired surfaces. This is particularly advantageous for those components that must not be covered in certain active component areas, without changing the properties of the component.

In one embodiment of the invention, therefore, the radiation layer is applied to a first surface area of the chip. A heat-loss generating element is arranged on or below a second surface area of the chip, wherein first and second surface areas are arranged side by side. Such an arrangement is advantageous in components in which the heat-loss generating element cannot be covered with a layer of material, without incurring disadvantages.

In the most advantageous variant, the radiation layer is a layer which conducts heat well, by comprising a very heat-conductive material. However, it is also possible to use a roughened or structured surface as the radiation layer and to combine this with a heat-conductive layer, which is then preferably arranged between the chip and the radiation layer.

Furthermore, it is advantageous if the heat-conductive layer extends over the first and second surface areas, but is guided below the radiation layer and below the heat-loss generating element, so that they can form there a heat-conducting path from the source of heat loss up to the radiation layer. Such a heat-conducting layer may in particular comprise a metal.

Advantageously, the radiation layer sits on the surface of the chip, on which the heat-loss generating element, in particular an electrically conductive structure, is arranged. However, it is also possible to arrange a cover layer over the heat-generating element which either rests directly on the heat-generating element or encloses it in a cavity forming beneath the cover layer.

The radiation layer can also be applied to the surface of the cover layer.

One example of an application of such a cover layer is so-called thin-film packages, in which sensitive component structures are encapsulated under cover layers forming a cavity. During their manufacturing, a structured sacrificial layer is first applied in the areas in which a cavity is to be formed. This sacrificial layer is subsequently covered by a cover layer and the sacrificial layer itself is dissolved out or etched away through holes in the cover layer. Subsequently, the holes in the cover layer are closed off. There remain closed cavities at the locations where the structured sacrificial layer was applied.

Such cover layers can be further mechanically stabilized by reinforcement layers. According to the invention, the radiation layer can be used for mechanically reinforcing the cavity housing or for reinforcing the cover layer. Heat transfer from the heat-generating element enclosed in the cavity can then take place at least in part via the atmosphere enclosed in the cavity and towards the cover layer and finally via the radiation layer into the outside world.

However, it is also possible to bring the radiation layer in the edge region of the enclosed cavities up to the chip surface or at least into the vicinity of the heat-loss generating element in order to shorten the heat conduction path between the heat-loss generating element and the radiation layer and thus to improve the heat conduction.

It is thus advantageous if the cover layer encloses only the cavity, i.e., the cavity in the housing, and terminates laterally to the cavity with the surface of the chip. In this case, the radiation layer applied thereto can then also be flush with the surface of the chip.

In one embodiment, the chip comprises a bulk acoustic wave BAW or FBAR resonator. A plurality of such resonators can be connected in series and parallel to a bandpass filter, so that a high electroacoustic power can be applied to individual BAW resonators, which inevitably leads to the generation of heat loss.

A radiation layer applied to the BAW resonator improves heat radiation from the resonator or from the chip. The radiation layer can be applied to a surface of the BAW resonator that does not include the top electrode. This has the advantage that in these areas the piezoelectric layer is exposed, which in turn consists of a crystalline material and in particular of aluminum nitride. In one embodiment, therefore, it is possible to roughen the surface of the piezoelectric layer exposed next to the top electrode so that the radiation layer is formed from the exposed surface area of the piezoelectric layer. However, it is also possible to additionally apply the radiation layer to this surface area and then roughen it accordingly.

In a further embodiment, the radiation layer is applied as a whole-area layer to the BAW resonator and then forms a partial layer of the layer stack, in which the acoustic wave can propagate during operation of the resonator. Then, however, the radiation layer must be included in the calculation of the resonance frequency. However, it is also possible to simultaneously use the radiation layer as the trim layer, by performing the etch-back process to expose the crystal surfaces inclined to the layer plane until the desired layer removal and the associated frequency shift, i.e., the trimming effect, is achieved.

Depending on the thermomechanical properties of such a radiation layer used as a trim layer, both a frequency increase and a frequency reduction of the resonant frequency of the BAW resonator can be achieved by reducing the layer thickness.

It is also possible for the chip to include a SAW component. These components have a piezoelectric substrate on which device structures are arranged which serve to generate, convert, propagate or reflect surface acoustic waves.

In one embodiment, the radiation layer is applied directly to a first surface area of the piezoelectric substrate that does not extend into the acoustic path of the surface waves. In this case, the radiation layer forms a mass load in an acoustically non-active surface area, where it is completely harmless as regards the function of the component. In this case, it is possible to bring the radiation layer close to the component structures and, in one embodiment, to structure it such that parts of the current-carrying bus bars or the current-carrying leads and contact pads are covered by the radiation layer.

In a further embodiment, the component comprises a SAW chip, in which an insulator layer, in particular a layer compensating the temperature coefficient of the center frequency, is applied over the surface carrying the component structures, in particular an $SiO_2$ layer.

In addition, the radiation layer can be applied via this $SiO_2$ layer, which has a negligible additional mass load compared to the $SiO_2$ layer, which has little or no effect on the acoustic properties of the SAW component. In this way, a good heat transfer from the component structures in which the heat loss is produced is made possible through the compensation layer and into the radiation layer and from this into the environment. The relatively large surface of the radiation layer improves heat dissipation into the environment.

Components such as in particular SAW and BAW components can be mounted on a carrier in a flip-chip design. In this arrangement, the component structures have bearing surfaces towards the carrier and are therefore arranged in an air gap between the chip and the carrier. In such an arrangement, a first radiation layer can now be arranged on the surface of the component chip facing the carrier, and a further radiation layer can be arranged on the surface of the carrier facing the chip. The enlarged surface of the radiation layer permits improved heat transport in both directions, not only from the (first) radiation layer into the environment, but also from the environment into the (further) radiation layer, which depends solely on the temperature gradient.

A radiation layer can therefore also serve as a heat absorption layer in this arrangement, so that a better heat transfer into the carrier through the gap between the component chip and the carrier is made possible. In the carrier itself, very heat-conductive layers, in particular metallic conducting paths and metallic surfaces, can form a further heat path, which is ultimately guided via vertical metal structures, in particular vias or other plated-through holes, even as far as the bottom side of the carrier. From the bottom side of the carrier, the heat can be dissipated via solder contacts into a circuit environment. However, it is also possible for the carrier with its electrically conductive structures to be a sufficiently large heat sink which can absorb enough heat loss without being heated up inadmissibly.

In addition to the already described preferably crystalline or polycrystalline radiation surfaces with a treated and in particular re-etched surface, other materials which form a rough surface are however suitable for forming the radiation layer.

For example, all materials are suitable which on the one hand have sufficient heat conductivity and on other hand can form layers with a high specific surface area, i.e., a heat-radiating surface. It is possible, for example, to form a radiation layer of individual particles. These may, for example, be dispersed in a thin layer of a binder or in a lacquer. Preferably, the concentration of the particles in the binder layer is so high that the particles protrude from the layer and form a large surface area.

From lacquer layers with sufficiently large filler particles and high solvent content, for example, the layer thickness can be reduced by removing the solvent until the filler particles contained therein protrude above the lacquer layer.

However, it is also possible to produce the radiation layer from materials which can be applied in particle form. For example, powder coatings that can be sintered for better consolidation are possible.

Carbon, in particular soot, is also a material with high thermal conductivity and high surface area.

The application of particles to produce a radiation layer with a high surface area can also be effected by means of a particle beam, in which solely the kinetic energy of the particles accelerated towards the surface of a substrate is sufficient to form a layer of sufficient layer cohesion and sufficient layer strength.

Spraying, vapor deposition or jetting are also suitable as a method for creating a radiation layer. A material in the form of lacquer or dispersion or suspension may also be printed or painted on.

By means of a jet printing process, the application of a radiation layer can also be structured, so that no subsequent structuring of the radiation layer is required and the said layer can be applied only in those areas where it does not interfere with the component function.

The invention will be explained in greater detail below with reference to exemplary embodiments and the associated figures. The figures shown are only schematic and not true to scale. Individual parts may be shown larger or smaller for greater clarity. The figures therefore represent neither absolute nor relative dimensions.

Figure 2:
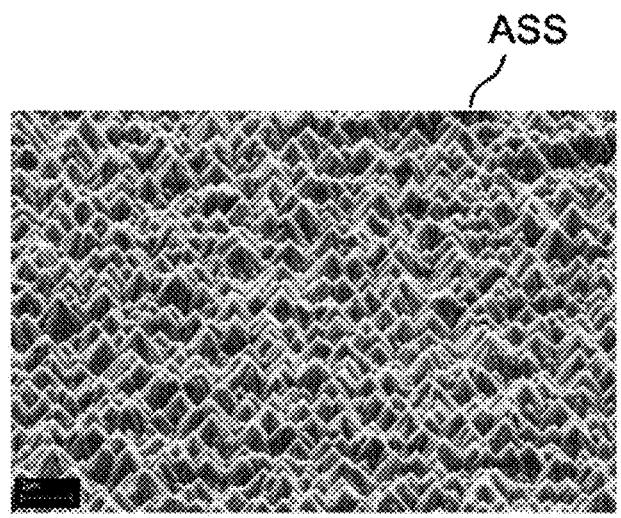
Figure 3:
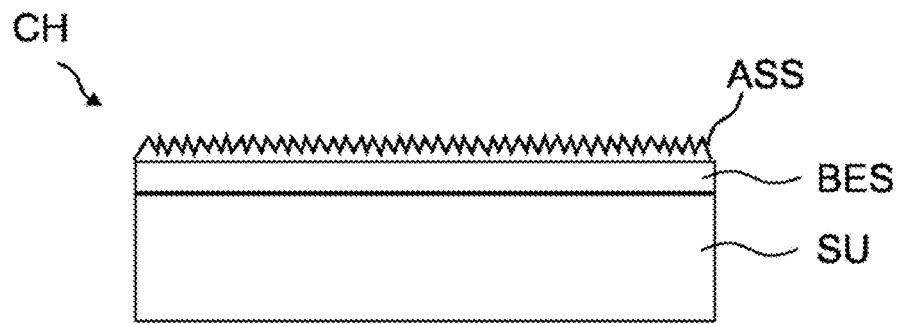
Figure 4:
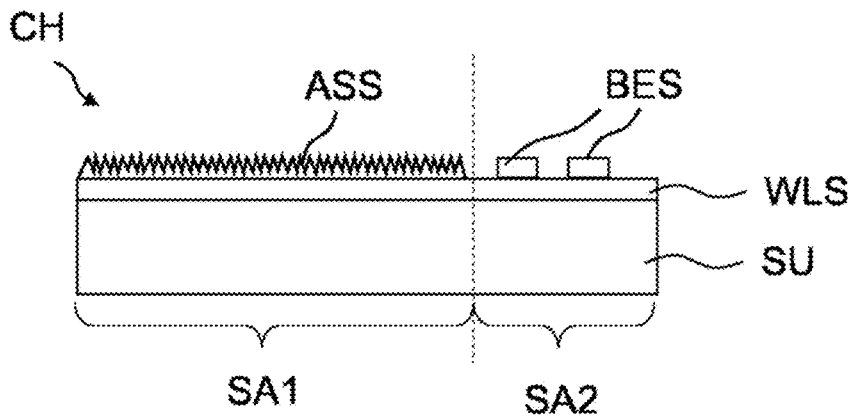
Figure 5:
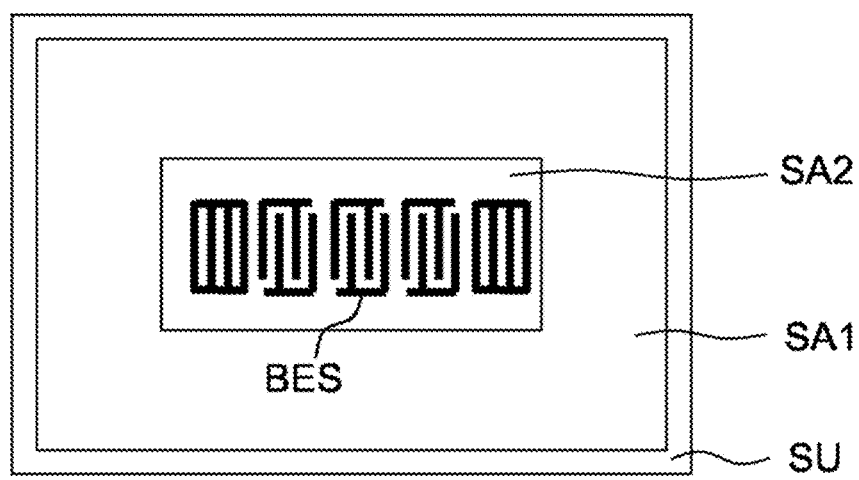
Figure 6:
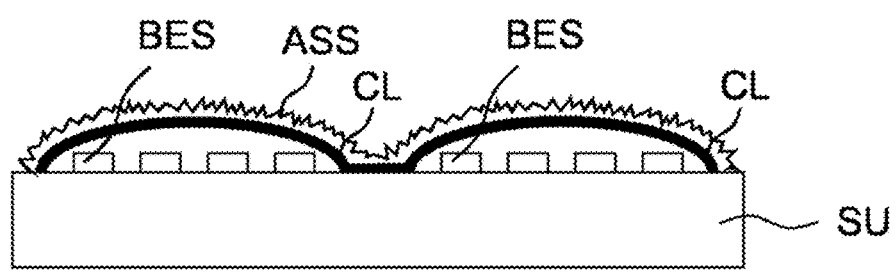
Figure 7:
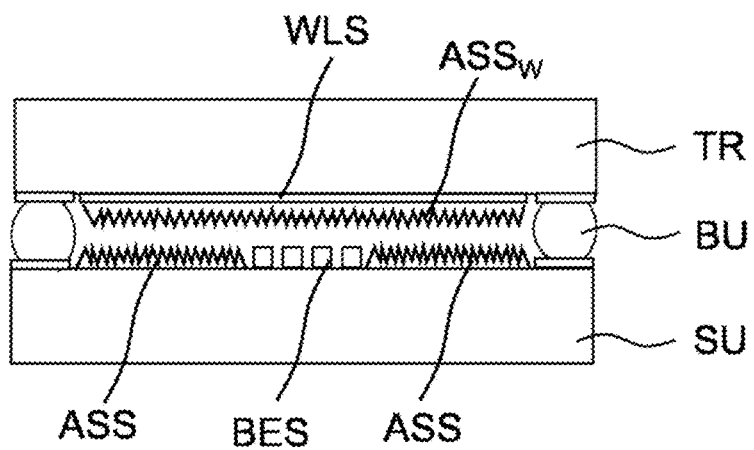
Figure 8:
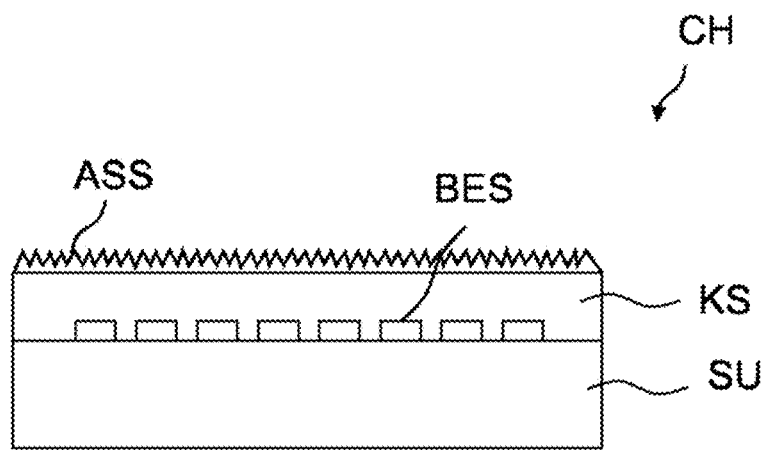
Figure 9:
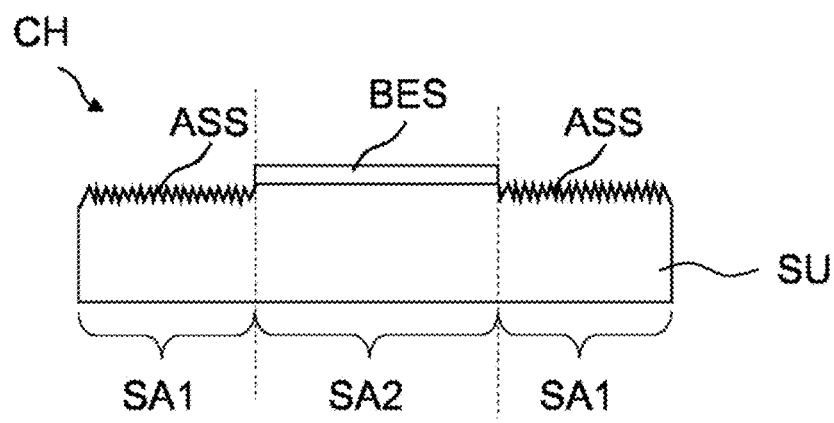
Figure 10:
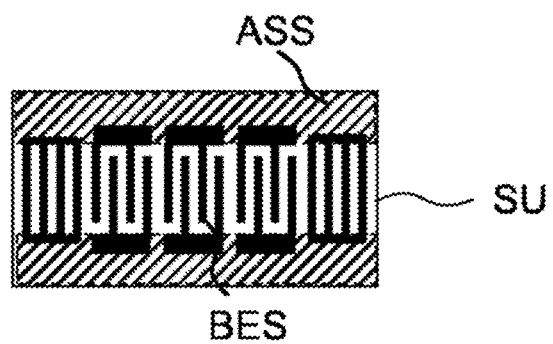
Figure 11:
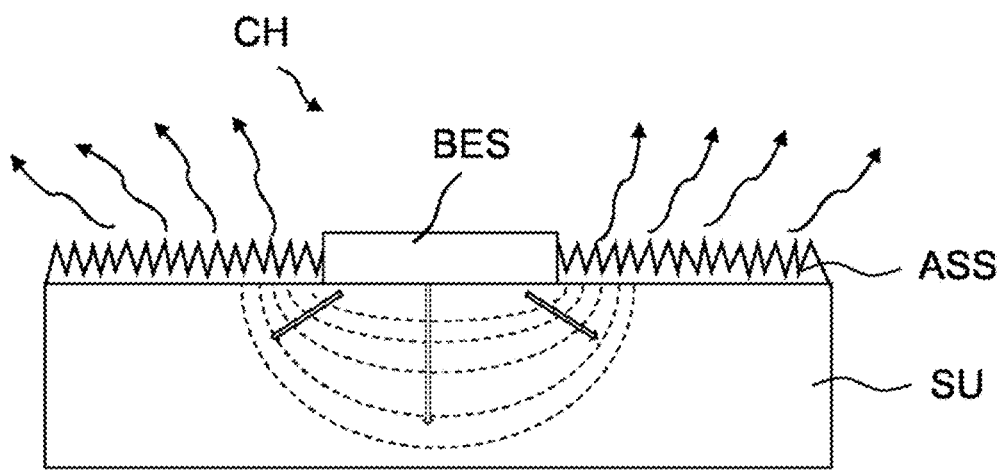
Figure 12:
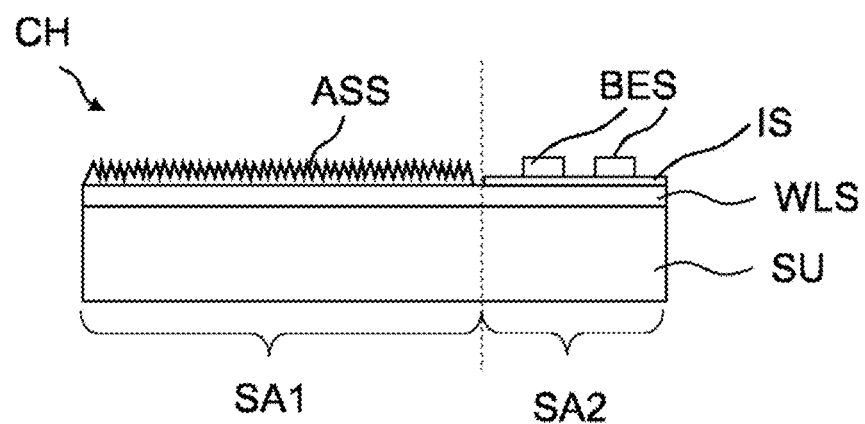

FIG. 1 shows a schematic cross-section through a component according to a first exemplary embodiment, FIG. 2 shows a photograph of a polycrystalline, roughened layer which is suitable as a radiation layer, FIG. 3 shows a schematic cross-section through a component according to a second exemplary embodiment, FIG. 4 shows a schematic cross-section through a component according to a third exemplary embodiment, FIG. 5 shows the plan view of a component according to an application example, FIG. 6 shows a component according to a fourth exemplary embodiment, FIG. 7 shows a component according to a fifth exemplary embodiment, FIG. 8 shows a sixth exemplary embodiment, FIG. 9 shows a seventh exemplary embodiment, FIG. 10 shows a plan view of a component with a structured radiation layer, FIG. 11 shows the heat distribution in a component according to the invention, FIG. 12 shows a further exemplary embodiment of the invention with reference to a schematic cross-section.

A simple exemplary embodiment is shown in FIG. 1 in schematic cross-section. The component comprises a chip CH which essentially consists of a substrate SU and component structures BES applied thereto. The component structures conduct current and generate heat loss during operation of the component. For faster dissipation of the heat loss, a radiation layer ASS is applied to the surface of the substrate, which occupies a first surface area of the chip CH in which no component structures BES are arranged in the exemplary embodiment shown. The radiation layer is a preferably thin layer, which is formed with a large surface area. In particular, the radiation layer comprises a material which has a better thermal conductivity than the substrate SU.

The radiation layer preferably exhibits no interaction with the component structures and is preferably an insulator which accordingly has no electromagnetic interaction with the component structures BES or other current-carrying elements.

FIG. 2 shows a scanning electron micrograph of a polycrystalline surface which can be used as a radiation layer ASS. The exemplary radiation layer ASS is a crystalline material which has grown along the crystal axis and therefore has a columnar structure. The surface of such a crystalline to polycrystalline layer can be etched back in a manner oriented to the crystal surface, exposing different crystal surfaces and crystal facets of the crystallites contained in the layer.

The columnar growth of a polycrystalline layer suitable as ASS is favored by:

Provision of a suitable growth layer which is provided under the polycrystalline layer and in particular has a suitable lattice structure, e.g. a lattice structure that fits the lattice structure of AlN.

Planar realization of the growth layer.

Prevention of contamination on surfaces (e.g. by previous process steps) on and below the growth layer.

During application, e.g. by a sputtering process, columnar growth is promoted by a low growth rate. Firstly, fine separate crystallites grow. As growth continues, the crystallites grow into each other. Overall, the areas crystallographically oriented relative to the surface then grow faster, so that crystal domains oriented in this direction eventually dominate and a layer with a columnar structure is created. The individual domains can then also be skewed relative to each other, but have predominantly parallel-oriented C axes.

A tapering of the crystallites is achieved by etching back oriented to the crystal axis, wherein crystal surfaces of the unit cell are exposed which are in regular alignment and have corresponding angles of inclination to the layer plane. Almost independently of the crystal lattice, pyramid-shaped tips are formed in almost all cases, each corresponding to crystal edges or corners of the unit cell.

Particularly advantageously, a grown-on crystal layer is first etched and then treated in a post-etching step with a wet-chemical or gaseous etchant which etches primarily at crystal defects and selectively etches different crystal facets of the crystal layer.

Particularly suitable for this purpose is the wet-chemical etchant KOH. As a gaseous etchant, for example, a corrosive gas such as H or Cl is suitable. H is preferably used as the etching gas at an elevated temperature, in particular at or above 800° C.

Preferably, wet-chemical etching is used in the pre-etching step. KOH in dilute form is particularly suitable as an etchant. In a particularly preferred embodiment of the invention KOH is used in this etching step at a concentration of 5% at room temperature, wherein the etching time is between 5 min and 15 min.

Alternatively, a dry etching process (RIE process) is also suitable for the pre-etching step, for example. As a rule, a dry etching process is directed so that in this embodiment of the invention surface irregularities are transferred into the crystal layer and thus a roughening of this layer is achieved.

In the pre-etching step, different crystal facets are exposed. After this, in a post-etching step, it is treated with another wet-chemical etchant, which mainly etches at crystal defects and selectively etches different crystal facets at the surface. In the example the further wet-chemical etchant contains KOH. By treating with KOH, the surface can be roughened very effectively. The roughness generated during the pretreatment is significantly improved in terms of efficiency for the heat dissipation of the radiation layer.

In the post-etching step, KOH in concentrated form is preferably used as etchant. In a further preferred embodiment of the invention, etching is done here with KOH at a concentration of 25% at a temperature between 70° C. and 90° C., for example at 80° C., wherein the etching time is between 3 min and 10 min.

Alternatively, a corrosive gas, for example H or Cl, can be used as an etchant for the post-etching step.

The figure shows the surface of the radiation layer ASS, which has a plurality of precisely these pointed pyramids whose side surfaces are crystal facets aligned in parallel to different crystal planes of the unit crystal. Aluminum nitride is an example of a material that can be provided with such a structure. However, other materials which grow in a crystalline or polycrystalline manner are known which can be provided in the same way with a rough pyramidal structure. By way of example, only gallium nitrides, aluminum oxide, silicon oxide, silicon carbide and amorphous carbon may be mentioned as substances which can be used in the same way to form a radiation layer with an increased surface area.

FIG. 3 shows, on the basis of a schematic cross-section, another chip CH, in which a large-area component structure BES is arranged on a substrate SU, for example a plate-shaped electrode. To improve the heat dissipation from the component comprising a chip CH, a radiation layer ASS is applied to the component structure BES, which is likewise characterized by its rough and thus enlarged surface. This embodiment is suitable for components that are not hindered in their function by an additional layer being applied or in which the interaction between the radiation layer ASS and the component can be monitored, so that the component properties are reproducibly adjustable despite the additional layer.

As an example of such an embodiment, capacitors, ceramic resistors, varistors or thermistors may be mentioned, all of which represent a component that generates sufficient heat loss during the normal operation of the component and lead to a heating of the component, which usefully is to be dissipated in an easy and quick manner.

With the radiation layer according to the invention, heat output from the component to the environment is improved.

If the environment comprises air as in the example shown, radiation will be improved, in particular in the infrared range, that is to say precisely in the area of heat radiation.

A further component that leads to improved heat dissipation with the illustrated design is a BAW resonator, which has a layered structure and whose uppermost electrode layer represents the illustrated component structure BES. With sufficiently high layer thickness uniformity of the radiation layer ASS, the acoustic properties of the BAW resonator are not unduly influenced.

FIG. 4 shows a component chip CH according to a third exemplary embodiment in schematic cross-section. The chip CH comprises a substrate SU onto which component structures BES are applied. However, in contrast to the first exemplary embodiment according to FIG. 1, a heat-conducting layer WLS is arranged between the substrate SU and the component structure BES. The heat-conducting layer extends over a first surface area SA1 with the radiation layer ASS and a second surface area SA2 with the component structures BES and thus represents a heat-conducting path between the heat-generating component structures BES and the radiation layer ASS. In this way heat transfer from the component structures to the radiation layer is improved.

For this embodiment, it is advantageous if the heat-conducting layer WLS is an insulator or is at least electrically insulated from the component structures, e.g. by means of an insulator layer (not shown in the figure). In one embodiment, heat-conducting layer WLS and radiation layer ASS may comprise the same material as e.g. aluminum nitride, which is an electrical insulator with high thermal conductivity.

In a modification of this embodiment, not shown, it is possible to use as heat-conducting layer WLS a material which can be provided with a large surface area by an appropriate application or post-treatment processes. In the first surface area SA1, the heat-conducting layer can then undergo the said post-treatment, whereby the surface is correspondingly roughened or enlarged. It is therefore not necessary to apply an additional radiation layer to such a heat-conducting layer WLS, but rather to transform only the first surface area of the heat-conducting layer into a radiation layer by roughening it.

FIG. 5 shows a plan view of a SAW component, which can advantageously be provided with a radiation layer ASS in a first surface area SA1. The component structures BES are applied to a piezoelectric substrate SU in the form of strip-shaped metallizations. The component structures form an acoustic track, in which at least one interdigital transducer is arranged between two reflectors. The surface acoustic wave is propagatable between the two reflectors so that the two reflectors bound the acoustic path.

The second surface area SA2 therefore comprises at least the acoustic path. On the other hand, the first surface area SA1 onto which the radiation layer ASS is applied or generated spares the second surface area, so that the radiation layer ASS does not interact acoustically with the surface acoustic wave. Also in this embodiment, it is possible to apply the radiation layer ASS as an additional layer onto the substrate in the first surface area SA1. However, it is also possible to structure the substrate in the first surface area SA1 accordingly and thus to provide it with an enlarged surface.

FIG. 6 shows a component according to a fourth exemplary embodiment with the aid of a schematic cross-section. The device is encapsulated in a thin-film package. The component comprises a substrate SU onto which component structures BES are applied. The device structures are mechanically sensitive and must be encapsulated such that a cavity forms over the device structures.

The thin-film package used for this purpose comprises a cover layer CL applied in a large area over the component structures, under which cavities for receiving the component structures are formed by means of a sacrificial layer which is later removed. A radiation layer ASS can now be applied to this cover layer CL. In this case, heat dissipation takes place from the component structures, in part via the air gap enclosed in the cavity, through the cover layer CL and into the radiation layer ASS, from which it can be dissipated more quickly due to the increased surface area.

A second part of the heat loss, which is generated in the component structures, is conducted via the substrate surface directly into the cover layer CL and from there into the radiation layer ASS. For this purpose, the cover layer CL in the area between different component structures is brought up as far as the surface of the substrate SU or at least up to its vicinity.

Alternatively, the cover layer is in a good heat-conducting connection with the surface of the substrate, for example via thermally highly conductive structures, such as via metallic structures. The cover layer CL may be an organic layer. Preferably, however, it comprises a ceramic layer etchable selectively against the sacrificial layer.

FIG. 7 shows, on the basis of a schematic cross-section, a fifth exemplary embodiment of a component with improved heat dissipation. The component comprises a component chip with a substrate SU, on the surface of which component structures BES are arranged. In the surface area of the substrate not occupied by the component structures BES, i.e., in the first surface area SA1, a radiation layer ASS is applied or generated. Also left out of the first surface area SA1 are electrical contact surfaces via which the chip is mounted on a carrier TR.

Bumps BU, taking the form of solder bumps or stud bumps, serve for electrical and mechanical connection. The component chip comprising the substrate SU is mounted on the carrier TR in such a way that the component structures BES face the carrier TR. On the substrate-facing surface of the carrier TR, a further radiation layer $ASS_w$ is arranged, which facilitates the transport of heat in the opposite direction, i.e., from the air gap between substrate and carrier into the carrier.

Beneath the further radiation layer ASSw, a heat-conducting layer WLS can be provided on the surface of the carrier TR, for example a metallic layer.

At least one metallization plane is provided in the carrier itself, via which an interconnection of different component structures that are electrically connected via the bumps, different chips or passive elements, not shown, is made possible.

Furthermore, vias may be routed to the upward-facing surface in the figure, on which contacts are provided for connection to a circuit environment (not shown in the figure). It is possible, on the one hand to use the metallic structures provided for electrical conduction within the support for heat dissipation. In addition, metallic heat guidance paths serving heat dissipation alone are possible, which lead to an outer surface of the arrangement.

FIG. 8 shows a sixth exemplary embodiment with the aid of a schematic cross-section. Here too, the chip once again comprises a substrate SU with component structures BES. However, the component structures are covered with a compensation layer KS, for example a silicon oxide layer, which serves to compensate for the temperature coefficient TCF of the frequency.

On the surface of the compensation layer KS, a radiation layer ASS is applied whose thickness is preferably small in relation to the thickness of the compensation layer KS. It is also possible to correspondingly roughen the compensation layer KS at the surface and thus to convert it into a radiation layer ASS, so that the additional application of a radiation layer is unnecessary.

The component may be embodied as a SAW component, wherein the component structures represent interdigital transducers and/or reflectors.

The device may be a semiconductor device and the chip may include a semiconductor substrate and component structures disposed thereon and/or integrated therein. In particular, the chip may include an integrated circuit.

FIG. 9 shows a seventh exemplary embodiment in a schematic cross-section through a chip CH, which has already been explained in connection with the previous figures as an alternative, not shown. In this exemplary embodiment, in the first surface areas SA1, the surface of the substrate SU is roughened and thus represents a radiation layer ASS, which therefore does not have to be applied separately. The area of the component structures BES corresponding to the second surface area SA2 is omitted from the roughening treatment in order to avoid an interaction with the component function.

FIG. 10 shows a plan view of a SAW component, in which the first surface area SA1, on which a radiation layer ASS is generated or applied to, extends over part of the component structures BES. Shown in FIG. 10 is an overlap of the radiation layer ASS with the bus bars of the interdigital transducers, which on the one hand ensures good thermal contact with the component structures and, on the other hand, does not impair the acoustic track, which does not reach all the way to the bus bars of the interdigital transducer.

FIG. 11 shows an exemplary temperature distribution, based on isotherms, within a component chip CH with an applied radiation layer ASS. The component structures BES, which represent the heat-loss generating element, also have the highest temperature range during operation of the component.

The isotherms extend through the substrate SU and represent lines that are at the same temperature. Arrows indicate the temperature gradient which points radially away from the component structures BES.

Since an improved heat dissipation to the environment takes place via the radiation layer ASS, represented by serpentine lines, a stronger temperature gradient arises in the lateral direction away from the component structures, which likewise improves heat radiation via the radiation layer ASS.

FIG. 12 shows a further embodiment variant of a component according to the invention. Here, similarly to the third exemplary embodiment according to FIG. 4, a heat-conducting layer WLS is applied over the entire surface of the substrate SU, which here may comprise a metal or another electrically conductive material. In order to prevent a short circuit of the component structures here, an insulation layer IS is arranged between component structures BES and heat-conducting layer WLS. This can extend over the entire heat-conducting layer WLS, but is advantageously arranged only in the second surface area SA2, i.e., below the component structures BES. In the first surface area SA1, the radiation layer ASS is applied.

Alternatively, the surface of the heat-conducting layer WLS is correspondingly roughened and no separate radiation layer ASS is applied.

Although not shown separately in the figures, the improved heat dissipation from the component may be combined with additional measures known in the prior art. For example, additional heat dissipation can take place via very heat-conductive structures, in particular via contact pads, bumps and other electrically conductive structures, something which does not hinder the improved heat radiation through the radiation layer ASS and can be easily combined with this. However, it is then advantageous to bring the radiation layer close to these heat-conducting structures, in order to also improve this heat contact flow and to improve the overall heat dissipation.

It was only possible to describe the invention within reference to a few exemplary embodiments and it is therefore not limited to these. The invention can be implemented on a variety of different components, can be realized using different materials for radiation layer and substrate.

The roughened surface of the radiation layer may be generated as described by a special treatment or alternatively may be a material-inherent layer property.

In particular, particles comprising layers having particle segments projecting above the layer plane also have a rough and thus an increased surface area.

The radiation layers can be mechanically strong or more loosely placed layers, since they are not exposed to mechanical stress. The radiation layers can be electrically insulating or electrically conductive, wherein in the latter case, an electrical contact with the component structures can be excluded.

Alternatively, planar component structures BES with a roughened surface can also function as a radiation layer, or radiation layers can assume component function.

LIST OF REFERENCE SIGNS

CH chip, comprising
SU substrate and on top of it
BES component structures (heat-loss generating element)
ASS radiation layer (=heat-radiating layer)
SA1 first surface area (with ASS)
SA2 second surface area (without ASS)
WLS additional heat-conducting layer, forming
CL cover layer
TR carrier
$ASS_w$ further radiation layer (heat-radiating layer) on carrier
BU bump
KS auxiliary layer, e.g. TCF compensation layer
IS insulating layer (FIG. 12)

The invention claimed is:

1. An electrical component with improved heat dissipation having a chip (CH) comprising a heat-loss generating element with an on-chip heat radiation layer (ASS) applied in thermal contact with the heat-loss generating element, wherein:
   the heat radiation layer has a roughened surface;
   the heat radiation layer (ASS) is applied to a first surface area (SA1) of the chip;
   the heat-loss generating element is arranged on a second surface area (SA2) of the chip;
   the first and second surface areas are arranged side by side; and
   a heat conducting layer (WLS) extends over the first and second surface areas (SA1, SA2), forming a heat-dissipation path on the chip (CH) but beneath the heat radiation layer (ASS) and the heat-loss generating element.

2. The electrical component according to claim 1, in which the heat radiation layer (ASS) has a columnar structure and is designed as a polycrystalline or crystalline layer.

3. The electrical component according to claim 2, in which the heat radiation layer (ASS) is an AlN layer, which is further enlarged by crystal-oriented back-etching in the roughened surface.

4. The electrical component according to claim 1, in which a cover layer (CL), on which the heat radiation layer (ASS) is arranged, extends over the heat-loss generating element.

5. The electrical component according to claim 4, in which the cover layer (CL) is part of a thin-film package, which is generated directly on the chip (CH) and forms a cavity for the heat-loss generating element.

6. The electrical component according to claim 5, in which the cover layer (CL) rests over the cavity and terminates adjacent to the cavity with a surface of the chip.

7. The electrical component according to claim 1, in which the chip comprises a BAW or FBAR resonator, and in which the heat radiation layer (ASS) is applied directly to an uppermost layer of the BAW or FBAR resonator.

8. The electrical component according to claim 1, in which the chip comprises a piezoelectric substrate and component structures (BES) arranged thereon, which are designed for generating, converting, propagating or reflecting surface acoustic waves (SAW), and in which the heat radiation layer (ASS) is applied directly to the piezoelectric substrate in the first surface area (SA1) adjacent to the component structures (BES), wherein the first surface area does not extend into an acoustic path of the surface acoustic waves.

9. The electrical component according to claim 1, in which the chip comprises a semiconductor substrate and component structures (BES) arranged thereon and/or integrated therein, and in which the chip is a semiconductor device.

10. The electrical component according to claim 9, in which the chip comprises an integrated circuit.

11. The electrical component according to claim 9, in which the chip is mounted in a flip-chip arrangement on a carrier so that a surface with the component structures (BES) and the heat radiation layer (ASS) faces the carrier (TR), and in which a further heat radiation layer (ASSw) is applied to a surface of the carrier (TR) facing the chip (CH).

12. The electrical component according to claim 1, in which the chip comprises a BAW or FBAR resonator.

* * * * *